US012613282B2

(12) United States Patent
Zhang et al.

(10) Patent No.: US 12,613,282 B2
(45) Date of Patent: Apr. 28, 2026

(54) SYSTEMS AND METHODS FOR DETERMINING BATTERY STATE OF CHARGE

(71) Applicant: Cirrus Logic International Semiconductor Ltd., Edinburgh (GB)

(72) Inventors: Yandong Zhang, Austin, TX (US); John L. Melanson, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 597 days.

(21) Appl. No.: 17/982,694

(22) Filed: Nov. 8, 2022

(65) Prior Publication Data

US 2024/0151776 A1 May 9, 2024

(51) Int. Cl.
| | |
|---|---|
| *G01R 31/3842* | (2019.01) |
| *G01R 31/36* | (2020.01) |
| *G01R 31/367* | (2019.01) |
| *G01R 31/3828* | (2019.01) |
| *G01R 31/3832* | (2019.01) |

(52) U.S. Cl.
CPC ....... *G01R 31/3842* (2019.01); *G01R 31/367* (2019.01); *G01R 31/3833* (2019.01); *G01R 31/3648* (2013.01); *G01R 31/3828* (2019.01)

(58) Field of Classification Search
CPC .............. G01R 31/3842; G01R 31/367; G01R 31/3833; G01R 31/3648; G01R 31/3828
See application file for complete search history.

(56) References Cited

U.S. PATENT DOCUMENTS

| | | | | |
|---|---|---|---|---|
| 2003/0085688 A1* | 5/2003 | Ullrich | ............... | G01R 31/3828 |
| | | | | 320/132 |
| 2013/0297243 A1* | 11/2013 | Baba | .................... | G01R 31/367 |
| | | | | 702/63 |
| 2017/0176541 A1 | 6/2017 | Shimizu | | |
| 2017/0225584 A1* | 8/2017 | Jin | ........................ | B60L 3/0046 |
| 2017/0242078 A1 | 8/2017 | Kuper et al. | | |
| 2018/0292462 A1* | 10/2018 | Itabashi | .............. | H01M 10/441 |
| 2021/0215768 A1 | 7/2021 | Zhang et al. | | |
| 2024/0177544 A1* | 5/2024 | Matsuda | ............. | H01M 10/425 |

OTHER PUBLICATIONS

International Search Report and Written Opinion of the International Searching Authority, International Application No. PCT/US2023/076417, mailed Feb. 23, 2024.

* cited by examiner

*Primary Examiner* — John C Kuan
(74) *Attorney, Agent, or Firm* — Jackson Walker L.L.P.

(57) ABSTRACT

A method for estimating a battery state of charge may include determining a first estimated state of charge and a first estimated accuracy of the state of charge using a first estimation approach, determining a second estimated state of charge and a second estimated accuracy of the state of charge using a second estimation approach, and estimating the battery state of charge based on the first estimated state of charge, the first estimated accuracy of the state of charge, the second estimated state of charge, and the second estimated accuracy of the state of charge.

10 Claims, 3 Drawing Sheets

SYSTEMS AND METHODS FOR DETERMINING BATTERY STATE OF CHARGE

FIELD OF DISCLOSURE

The present disclosure relates in general to circuits for electronic devices, including without limitation personal portable devices such as wireless telephones and media players, and more specifically, to determining state of charge of a battery in real time.

BACKGROUND

Portable electronic devices, including wireless tele-phones, such as mobile/cellular telephones, tablets, cordless telephones, mp3 players, and other consumer devices, are in widespread use. Such portable electronic devices are often powered by a battery (e.g., a lithium-ion battery). In battery-powered devices, it is often desirable to determine a state of charge of the battery, as such state of charge may be indicative of a remaining usage time of the battery.

One existing approach to determining state of charge comprises using a circuit referred to as a coulomb counter to measure an amount of electrical charge drawn from a battery and delivered to the battery using mathematical integration of measured current. While current integration may be accurate over short periods of time, it may suffer from accumulation error after a long time of measurement. Another existing approach is determination of state of charge using a measured voltage associated with the battery. However, such approach may suffer from a voltage lookup-introduced instantaneous error. Some traditional approaches also use a combination of the current integration and volt-age-based approaches.

Approaches that overcome such disadvantages may be desired.

SUMMARY

In accordance with the teachings of the present disclosure, certain disadvantages and problems associated with existing approaches to determining battery state of charge may be reduced or eliminated.

In accordance with embodiments of the present disclo-sure, a method for estimating a battery state of charge may include determining a first estimated state of charge and a first estimated accuracy of the state of charge using a first estimation approach, determining a second estimated state of charge and a second estimated accuracy of the state of charge using a second estimation approach, and estimating the battery state of charge based on the first estimated state of charge, the first estimated accuracy of the state of charge, the second estimated state of charge, and the second esti-mated accuracy of the state of charge.

In accordance with these and other embodiments of the present disclosure, a system for estimating a battery state of charge may include logic for determining a first estimated state of charge and a first estimated accuracy of the state of charge using a first estimation approach, logic for determin-ing a second estimated state of charge and a second esti-mated accuracy of the state of charge using a second estimation approach, and logic for estimating the battery state of charge based on the first estimated state of charge, the first estimated accuracy of the state of charge, the second estimated state of charge, and the second estimated accuracy of the state of charge.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the example, present embodiments and certain advantages thereof may be acquired by referring to the following description taken in conjunction with the accompanying drawings, in which like reference numbers indicate like features, and wherein.

DETAILED DESCRIPTION

Figure 1:
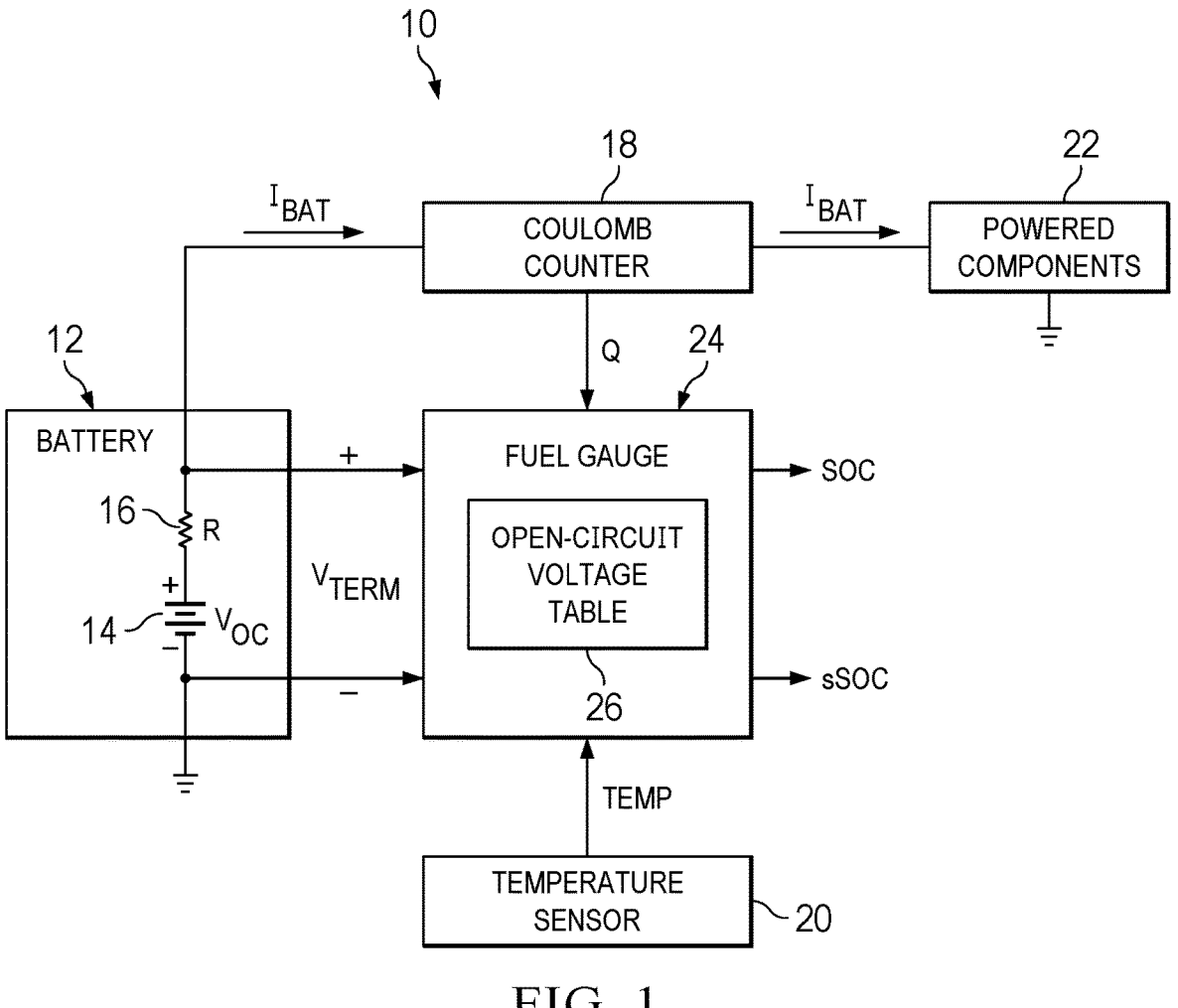
FIG. 1 illustrates a block diagram of an example battery-powered device, in accordance with embodiments of the present disclosure.

FIG. 1 illustrates a block diagram of an example battery-powered device 10, in accordance with embodiments of the present disclosure. As shown in FIG. 1, device 10 may include a battery 12, a coulomb counter 18, a temperature sensor 20, and one or more powered components 22. Device 10 may include any device that may include functional components powered from battery 12, including without limitation a smartphone, a tablet, a game controller, or other mobile device.

Battery 12 may comprise any source of electric energy comprising one or more electrochemical cells 14 with exter-nal connections for powering electrical devices, such as powered components 22, wherein such electrochemical cells 14 are configured to convert electrochemical energy into electrical energy. In some embodiments, battery 12 may be a rechargeable battery capable of converting electrical energy received by battery 12 into electrochemical energy stored within electrochemical cells 14.

As shown in FIG. 1, battery 12 may include, in addition to electrochemical cells 14, an internal equivalent imped-ance represented by resistor 16 having resistance R. Accord-ingly, a terminal voltage $V_{TERM}$ measured across terminals of battery 12 may differ from an open-circuit voltage $V_{OC}$ of battery 12 in the presence of a current $I_{BAT}$ drawn from battery 12 (e.g., $V_{TERM}=V_{OC}-R \cdot I_{BAT}$).

Coulomb counter 18 may include any system, device, or apparatus configured to accumulate charge Q sourced from or delivered to battery 12. For example, as known in the art, coulomb counter 18 may use mathematical integration of current $I_{BAT}$.

Temperature sensor 20 may comprise any system, device, or apparatus configured to sense a temperature TEMP proxi-mate to battery 12, and may include a thermistor, thermo-couple, and/or other suitable device.

Powered components 22 may include one or more electric and/or electronic devices that may be adapted to carry out functionality of device 10, and may include without limitation one or more processors, memories, microphones, speakers, and/or touch-screen displays.

Fuel gauge 24 may comprise any suitable system, device, or apparatus, (e.g., a digital signal processor accordingly programmed) to receive terminal voltage $V_{TERM}$, charge Q, and temperature TEMP, and based on such measurements, determine a state of charge SOC of battery 12 in real time. Further, in addition to determining state of charge SOC, fuel gauge 24 may determine a variance sSOC of state of charge SOC based on terminal voltage $V_{TERM}$, sense voltage $V_{SNS}$, and temperature TEMP. Fuel gauge 24 may further report state of charge SOC and state of charge variance sSOC to another component (not explicitly shown) of device 10 which may further process such parameters.

Fuel gauge 24 may include analog-to-digital conversion circuitry configured to convert measurements of terminal voltage $V_{TERM}$, accumulated charge Q, and temperature T into digitally discrete measurements for charge Q(k), voltage V(k), and temperature T(k). Thus, each of charge Q(k), voltage V(k), and temperature T(k) may comprise a time series wherein k=1, 2, 3, . . . may be a running index of the time series. Further, a time series for current I(k) may also be derived based on values of charge Q(k) (e.g., I(k)=Q(k)−Q(k−1). Accordingly, as described in greater detail below, fuel gauge 24 may determine and report state of charge SOC(k) and state of charge variance sSOC(k).

In order to determine state of charge SOC(k) and state of charge variance sSOC(k), fuel gauge 24 may ascertain a battery state of battery 12. For purposes of this disclosure, battery 12 may be in one of two states: an active state or a relaxation state. Battery 12 may be in the relaxation state when, at a particular time k: (a) current has been zero for a predetermined amount of time (e.g., one hour) before time k; (b) a voltage difference dV(k)=V(k)−V(k−1) is less than a threshold (e.g., 1 microvolt), and (c) current I(k)=0. If any of such conditions are not met, then battery 12 may be in the active state.

A consequence of the condition that current must be zero for a predetermined amount of time means the relaxation state relies on memory, in that whether battery 12 is in the relaxation state may only be determined by knowing historical information regarding current. Thus, fuel gauge 24 may implement a counter C(k) which may be defined to store a value indicative of the amount of time current has been zero. Thus, battery 12 may be said to be in the relaxation states when: (a) $C(k)>C_{THRESH}$; (b) dV(k) $<V_{THRESH}$, and (c) I(k)=0, wherein $C_{THRESH}$ is a counter threshold associated with the predetermined amount of time before time k and $V_{THRESH}$ is a threshold for voltage difference dV(k).

As shown in FIG. 1, fuel gauge 24 may have stored therein an open-circuit voltage table 26. A relationship among open circuit voltage $V_{OC}$, state of charge SOC, and temperature TEMP may be obtained by characterization (e.g., during manufacturing and/or laboratory testing of battery 12 and/or batteries substantially identical to battery 12). Via the lookup table, a state of charge SOC may be found for any given value of open-circuit voltage $V_{OC}$ and a temperature TEMP, particularly during the relaxation period when $I_{BAT}$=0. Accordingly, during the relaxation period, SOC(k)=f(V(k), T(k)) wherein open-circuit voltage table 26 defines the function.

Although open-circuit voltage table 26 is shown as integral to fuel gauge 24 in FIG. 1, in some embodiments, open-circuit voltage table 26 may be stored in a memory external to and accessible by fuel gauge 24.

In addition to estimating state of charge SOC as a function of open circuit voltage $V_{OC}$ and temperature TEMP, for a known voltage V(k) and variance sV(k) of voltage, fuel gauge 24 may be able to estimate variance sSOC(k) from open-circuit voltage table 26.

In addition to a variance sSOC(k) existing in the voltage-based lookup approach, by using a known error p from a hardware specification of coulomb counter 18, a variance sQ(t) of the charge accumulated by coulomb counter 18 may be given by sQ(t)=f(p).

With estimates of state of charge based on both a voltage lookup approach and a coulomb counter approach and variances for both approaches, which may serve in effect as a "confidence" score for the estimates, fuel gauge 24 may estimate state of charge SOC(k) and its variance sSOC(k) as a function of voltage-based lookup state of charge $SOC_V(k)$ and variance $sSOC_V(k)$ and coulomb-counter-based state of charge $SOC_Q(k)$ and variance $sSOC_Q(k)$. Examples of approaches for estimating state of charge SOC(k) and variance sSOC(k) based on $SOC_V(k)$, $sSOC_V(k)$, $SOC_Q(k)$, and $sSOC_Q(k)$ are described below with reference to FIGS. 2 and 3.

Figure 2:
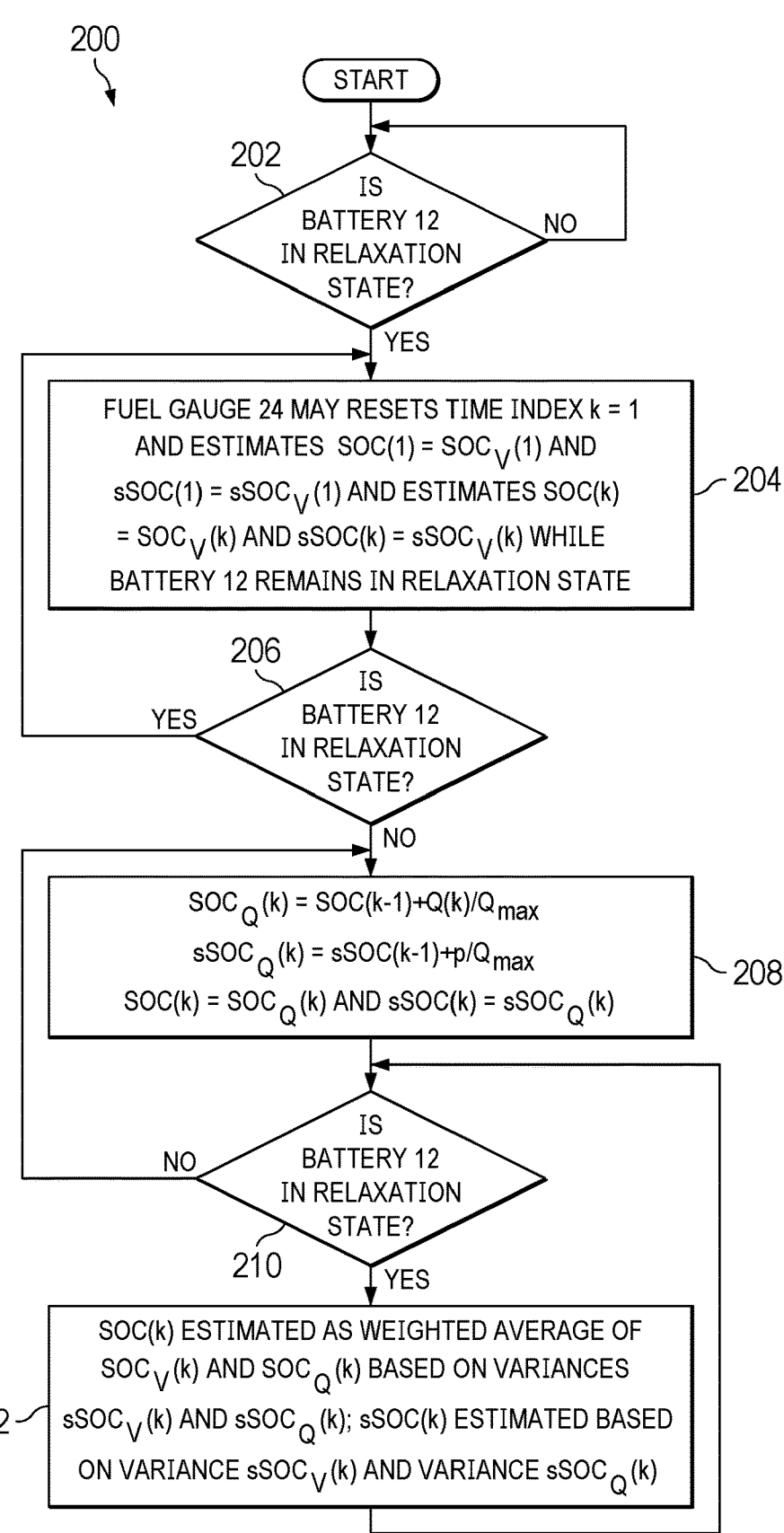
FIG. 2 illustrates a flow chart of an example method for determining battery state of charge, in accordance with embodiments of the present disclosure.

FIG. 2 illustrates a flow chart of an example method 200 for determining battery state of charge, in accordance with embodiments of the present disclosure. According to certain embodiments, method 200 may begin at step 202. As noted above, teachings of the present disclosure may be implemented in a variety of configurations of device 10. As such, the preferred initialization point for method 200 and the order of the steps comprising method 200 may depend on the implementation chosen. In these and other embodiments, method 200 may be implemented as firmware, software, applications, functions, libraries, or other instructions.

At step 202, fuel gauge 24 may determine if battery 12 is in the relaxation state. During this determination, fuel gauge 24 may not output an estimate for state of charge SOC(k). At the first moment battery 12 is in the relaxation state, method 200 may proceed to step 204, and may remain at step 202 until such time.

At step 204, fuel gauge 24 may reset the time index k=1, and estimate an initial state of charge SOC(1) and variance sSOC(1) using the voltage-based lookup approach (e.g., $SOC(1)=SOC_V(1)$ and $sSOC(1)=sSOC_V(1)$). While battery 12 remains in the relaxation state, fuel gauge 24 may estimate state of charge SOC(k) and variance sSOC(k) using the voltage-based lookup approach (e.g., $SOC(k)=SOC_V(k)$ and $sSOC(k)=sSOC_V(k)$).

At step 206, fuel gauge 24 may determine if battery 12 remains in the relaxation state. If battery 12 remains in the relaxation state, method 200 may proceed again to step 204. Otherwise, if in the active state, method 200 may proceed to step 208.

At step 208, for any moment in the active state, fuel gauge 24 may estimate state of charge SOC(k) and variance sSOC(k) using the coulomb-counter-based approach (e.g., $SOC(k)=SOC_Q(k)$ and $sSOC(k)=sSOC_Q(k)$), wherein $SOC_Q(k)=SOC(k-1)+Q(k)/Q_{max}$ and $sSOC_Q(k)=sSOC(k-1)+p/Q_{max}$, wherein $Q_{max}$ is a known constant parameter representing a maximum amount of charge.

At step 210, fuel gauge 24 may determine if battery 12 is in the relaxation state. If battery 12 remains in the relaxation state, method 200 may proceed to step 212. Otherwise, if in the active state, method 200 may proceed again to step 208.

At step 212, for any moment in the relaxation state other than the first relaxation moment during step 204, fuel gauge 24 may calculate both voltage-based lookup state of charge $SOC_V(k)$ and its variance $sSOC_V(k)$ and coulomb-counterbased state of charge $SOC_Q(k)$ and its variance $sSOC_Q(k)$, and then estimate state of charge $SOC(k)$ as a weighted average of $SOC_V(k)$ and $SOC_Q(k)$ based on variances $sSOC_V(k)$ and $sSOC_Q(k)$ (i.e., such that the approach with the lower variance is given a heavier weight in the weighted average). For example, in some embodiments, fuel gauge 24 may use the known inverse variance weighted average algorithm or any other suitable approach for determining a weighted average. In addition to estimating state of charge $SOC(k)$, fuel gauge 24 may also estimate variance $sSOC(k)$ based on variance $sSOC_V(k)$ and variance $sSOC_Q(k)$, using any suitable approach. After completion of step 212, method 200 may proceed again to step 210.

Although FIG. 2 discloses a particular number of steps to be taken with respect to method 200, method 200 may be executed with greater or fewer steps than those depicted in FIG. 2. In addition, although FIG. 2 discloses a certain order of steps to be taken with respect to method 200, the steps comprising method 200 may be completed in any suitable order.

Method 200 may be implemented using fuel gauge 24, components thereof or any other system operable to implement method 200. In certain embodiments, method 200 may be implemented partially or fully in software and/or firmware embodied in computer-readable media.

Figure 3:
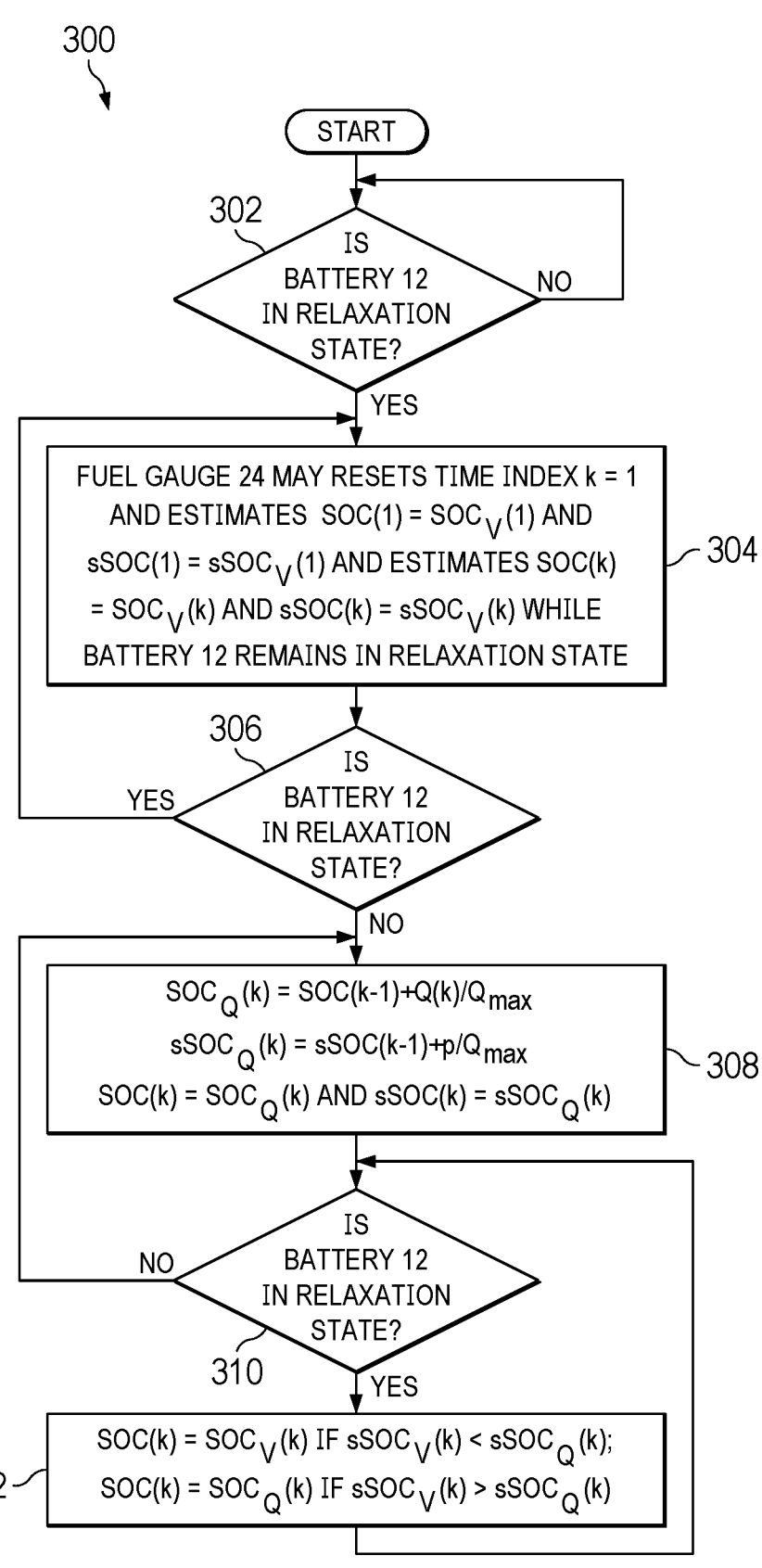
FIG. 3 illustrates a flow chart of another example method for determining battery state of charge, in accordance with embodiments of the present disclosure.

FIG. 3 illustrates a flow chart of an example method 300 for determining battery state of charge, in accordance with embodiments of the present disclosure. According to certain embodiments, method 300 may begin at step 302. As noted above, teachings of the present disclosure may be implemented in a variety of configurations of device 10. As such, the preferred initialization point for method 300 and the order of the steps comprising method 300 may depend on the implementation chosen. In these and other embodiments, method 300 may be implemented as firmware, software, applications, functions, libraries, or other instructions.

At step 302, fuel gauge 24 may determine if battery 12 is in the relaxation state. During this determination, fuel gauge 24 may not output an estimate for state of charge $SOC(k)$. At the first moment battery 12 is in the relaxation state, method 300 may proceed to step 304, and may remain at step 302 until such time.

At step 304, fuel gauge 24 may reset the time index $k=1$, and estimate an initial state of charge $SOC(1)$ and variance $sSOC(1)$ using the voltage-based lookup approach (e.g., $SOC(1)=SOC_V(1)$ and $sSOC(1)=sSOC_V(1)$). While battery 12 remains in the relaxation state, fuel gauge 24 may estimate state of charge $SOC(k)$ and variance $sSOC(k)$ using the voltage-based lookup approach (e.g., $SOC(k)=SOC_V(k)$ and $sSOC(k)=sSOC_V(k)$).

At step 306, fuel gauge 24 may determine if battery 12 remains in the relaxation state. If battery 12 remains in the relaxation state, method 300 may proceed again to step 304. Otherwise, if in the active state, method 300 may proceed to step 308.

At step 308, for any moment in the active state, fuel gauge 24 may estimate state of charge $SOC(k)$ and variance $sSOC(k)$ using the coulomb-counter-based approach (e.g., $SOC(k)=SOC_Q(k)$ and $sSOC(k)=sSOC_Q(k)$), wherein $SOC_Q(k)=SOC(k-1)+Q(k)/Q_{max}$ and $sSOC_Q(k)=sSOC(k-1)+p/Q_{max}$, wherein $Q_{max}$ is a known constant parameter representing a maximum amount of charge.

At step 310, fuel gauge 24 may determine if battery 12 is in the relaxation state. If battery 12 remains in the relaxation state, method 300 may proceed to step 312. Otherwise, if in the active state, method 300 may proceed again to step 308.

At step 312, for any moment in the relaxation state other than the first relaxation moment during step 304, fuel gauge 24 may calculate both voltage-based lookup state of charge $SOC_V(k)$ and its variance $sSOC_V(k)$ and coulomb-counter-based state of charge $SOC_Q(k)$ and its variance $sSOC_Q(k)$, and then estimate state of charge $SOC(k)$ as being $SOC_V(k)$ if $sSOC_V(k)<sSOC_Q(k)$ and as being $SOC_Q(k)$ if $sSOC_V(k)>sSOC_Q(k)$. After completion of step 312, method 300 may proceed again to step 310.

Although FIG. 3 discloses a particular number of steps to be taken with respect to method 300, method 300 may be executed with greater or fewer steps than those depicted in FIG. 3. In addition, although FIG. 3 discloses a certain order of steps to be taken with respect to method 300, the steps comprising method 300 may be completed in any suitable order.

Method 300 may be implemented using fuel gauge 24, components thereof or any other system operable to implement method 300. In certain embodiments, method 300 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method for estimating a battery state of charge, comprising:
   measuring a terminal voltage and current of a battery;
   determining whether the battery is in a relaxation state, wherein the battery is in the relaxation state when:
      the current of the battery has been approximately zero for a predetermined amount of time;
      a difference in the terminal voltage is less than a threshold difference; and
      the current of the battery is zero;
   determining a first estimated state of charge and a first estimated accuracy of the state of charge using a first estimation approach;
   determining a second estimated state of charge and a second estimated accuracy of the state of charge using a second estimation approach; and
   in response to determining that the battery is in the relaxation state, estimating the battery state of charge as a weighted average of the first estimated state of charge and the second estimated state of charge as an inverse variance weighted average based on the first estimated accuracy of the state of charge and the second estimated accuracy of the state of charge.

2. The method of claim 1, further comprising estimating an accuracy of the battery state of charge based on the first estimated accuracy of the state of charge and the second estimated accuracy of the state of charge.

3. The method of claim 1, wherein the first estimation approach comprises a voltage-based lookup of the first estimated state of charge and the first estimated accuracy of the state of charge from a table constructed based on characterization of the battery and further wherein:
   determining the first estimated state of charge comprises looking up the first estimated state of charge based on a measured voltage associated with the battery; and
   determining the first estimated accuracy of the state of charge comprises looking up the first estimated accuracy of the state of charge based on the measured voltage associated with the battery.

4. The method of claim 1, wherein the second estimation approach comprises a coulomb-counter based estimation as a function of electrical charge flowing to and from the battery and further wherein:
   determining the second estimated state of charge comprises estimating the second estimated state of charge based on electrical charge flowing to and from the battery; and

determining the second estimated accuracy of the state of charge comprises estimating the second estimated accuracy of the state of charge based on electrical charge flowing to and from the battery.

5. The method of claim 1, wherein:
   the first estimated accuracy of the state of charge comprises a first estimated variance of the state of charge; and
   the second estimated accuracy of the state of charge comprises a second estimated variance of the state of charge.

6. A system for estimating a battery state of charge, comprising:
   a processor configured to:
      measure a terminal voltage and current of a battery;
      determine whether the battery is in a relaxation state, wherein the battery is in the relaxation state when:
         the current of the battery has been approximately zero for a predetermined amount of time;
         a difference in the terminal voltage is less than a threshold difference; and
         the current of the battery is zero;
      determine a first estimated state of charge and a first estimated accuracy of the state of charge using a first estimation approach;
      determine a second estimated state of charge and a second estimated accuracy of the state of charge using a second estimation approach; and
      estimate, in response to determining that the battery is in the relaxation state, the battery state of charge as a weighted average of the first estimated state of charge and the second estimated state of charge as an inverse variance weighted average based on the first estimated accuracy of the state of charge and the second estimated accuracy of the state of charge.

7. The system of claim 6, wherein the processor is further configured to estimate an accuracy of the battery state of charge based on the first estimated accuracy of the state of charge and the second estimated accuracy of the state of charge.

8. The system of claim 6, wherein the first estimation approach comprises a voltage-based lookup of the first estimated state of charge and the first estimated accuracy of the state of charge from a table constructed based on characterization of the battery and further wherein:
   determining the first estimated state of charge comprises looking up the first estimated state of charge based on a measured voltage associated with the battery; and
   determining the first estimated accuracy of the state of charge comprises looking up the first estimated accuracy of the state of charge based on the measured voltage associated with the battery.

9. The system of claim 6, wherein the second estimation approach comprises a coulomb-counter based estimation as a function of electrical charge flowing to and from the battery and further wherein:
   determining the second estimated state of charge comprises estimating the second estimated state of charge based on electrical charge flowing to and from the battery; and
   determining the second estimated accuracy of the state of charge comprises estimating the second estimated accuracy of the state of charge based on electrical charge flowing to and from the battery.

10. The system of claim 6, wherein:

the first estimated accuracy of the state of charge comprises a first estimated variance of the state of charge; and the second estimated accuracy of the state of charge comprises a second estimated variance of the state of charge.

* * * * *